United States Patent
Müller et al.

(10) Patent No.: US 8,679,361 B2
(45) Date of Patent: Mar. 25, 2014

(54) METHOD AND DEVICE FOR CHARACTERIZING WAFERS DURING THE PRODUCTION OF SOLAR CELLS

(75) Inventors: Jörg Müller, Sandersdorf (DE); Jörg Isenberg, Leipzig (DE); Jörn Suthues, Leipzig (DE); Martin Bivour, Berlin (DD); Jean Patrice Rakotoniaina, Halle/Saale (DE)

(73) Assignee: Q-Cells SE, Bitterfeld-Wolfen (DE)

( * ) Notice: Subject to any disclaimer, the term of this patent is extended or adjusted under 35 U.S.C. 154(b) by 1181 days.

(21) Appl. No.: 11/871,061

(22) Filed: Oct. 11, 2007

(65) Prior Publication Data
US 2008/0087643 A1 Apr. 17, 2008

(30) Foreign Application Priority Data

Oct. 13, 2006 (DE) .......................... 10 2006 049 683

(51) Int. Cl.
*B44C 1/22* (2006.01)

(52) U.S. Cl.
USPC .................................. 216/87; 216/83; 216/85

(58) Field of Classification Search
USPC ................................................. 216/83, 85, 87
See application file for complete search history.

(56) References Cited

U.S. PATENT DOCUMENTS

| | | | | |
|---|---|---|---|---|
| 3,939,415 A | * | 2/1976 | Terasawa ....................... | 324/767 |
| 5,430,386 A | * | 7/1995 | Morin et al. ................... | 324/765 |
| 5,541,140 A | * | 7/1996 | Goebel et al. ................. | 438/380 |
| 5,560,857 A | * | 10/1996 | Sakon et al. .................. | 510/175 |
| 6,013,872 A | | 1/2000 | Woditsch et al. | |
| 6,116,254 A | | 9/2000 | Shiramizu | |
| 6,815,605 B1 | | 11/2004 | Abe et al. | |
| 2004/0100280 A1 | * | 5/2004 | Ju et al. ........................ | 324/642 |

FOREIGN PATENT DOCUMENTS

| | | |
|---|---|---|
| EP | 11114885 A1 | 7/2001 |
| JP | 05-129402 | 5/1993 |
| JP | 06-283584 | 10/1994 |
| JP | 10-297993 | 11/1998 |
| JP | 3679366 | 5/2005 |
| JP | 2005-229026 | 8/2005 |

OTHER PUBLICATIONS

Yablonovitch et al., Unusually Low Surface-Recombination Velocity on Silicon and Germanium Surfaces, Physical Review Letters, vol. 57 No. 2, 1986, pp. 249-252.

(Continued)

*Primary Examiner* — Shamim Ahmed
(74) *Attorney, Agent, or Firm* — Workman Nydegger

(57) ABSTRACT

The invention relates to a method and device for characterizing wafers during the production of solar cells. Characterizing wafers includes a) providing a wafer and carrying out a production process with the wafer for producing a solar cell or a plurality of solar cells; b) carrying out a wet chemical step with the wafer during the production process, wherein the wet chemical step decreases an influence of the wafer surface on a lifetime of charge carriers in the wafer; c) irradiating the wafer with light for creating the charge carriers in the wafer during the wet chemical step or after the wet chemical step; d) determining the lifetime of the charge carriers created in step c); and e) characterizing the wafer by means of the lifetime determined in step d).

18 Claims, 1 Drawing Sheet

(56) References Cited

OTHER PUBLICATIONS

Enjalbert et al., Automated In-Line Control of Electrical Parameters on Large Dimension MC-SI Wafers on Industrial Scale, published in Barcelona Jun. 6, 2005 to Jun. 10, 2005.
Manufacturer: Semilab Inc.: WT-85X 400, Mar. 16, 2005.
Cuevas, et al., "A contactless photoconductance technique to evaluate the quantum efficiency of solar cell emitters," Solar Energy Materials & Solar Cells 71 (2002) 295-312.
Search Report in related EPO application EP070118372; mailed Aug. 18, 2010.
Notification of Reasons for Rejection for JP 2007-267981 dated Feb. 8, 2011.
Horany, et al., In situ lifetime measurement on silicon with a chemically passivated surface, Applied Surface Science, Elsevier, Amsterdam, NL, vol. 63, No. 1-4, Jan. 1, 1993, p. 306-311.
Palais O, et al., High resolution lifetime scan maps of silicon wafers, Materials Science and Engineering B, Elsevier Sequoia, Lausanne, CH, vol. 71, No. 1-3, Feb. 1, 2000, p. 47-50.

* cited by examiner

METHOD AND DEVICE FOR CHARACTERIZING WAFERS DURING THE PRODUCTION OF SOLAR CELLS

BACKGROUND OF THE INVENTION

The invention relates to a method and a device for characterizing wafers during the production of solar cells.

As is known, a solar cell encompasses a semiconductor material, in which sunlight is converted into electric current by means of optical absorption. During the production of solar cells, semiconductor wafers are used, from which in each case one solar cell or a plurality of solar cells are produced in a production process. A criterion for the quality of the wafers used for the production of solar cells is, in particular, the lifetime of charge carriers created in the wafer by means of light absorption.

The lifetime is a measure for the period which passes until a created charge carrier returns into its energetic initial state (recombined). In principle, a higher efficiency is thus to be expected when using a wafer with a high charge carrier lifetime for the production of the solar cells.

Typically, silicon is used as the base material for solar cells. The lifetime of charge carriers created by exposure to light is dominated in silicon by means of recombination of the charge carriers via energy states, which are based on foreign atoms (that is, impurities) or on crystal defects. In a wafer comprising few impurities and crystal defects, respectively, generated charge carriers will have a higher lifetime, because fewer recombination centers are available.

A difficulty in assessing the quality of a wafer by means of a lifetime measurement is that the lifetime of charge carriers created in the wafer is influenced by recombination via surface conditions. In particular, in thin wafers, the measurable lifetime is dominated by the surface influence so that the determination of the lifetime would mainly provide a conclusion regarding the surface of the wafer. However, the lifetime of the charge carriers created in the volume of the wafer is crucial for a quality assessment of a wafer by means of the lifetime.

Only an effective total lifetime, which is a function of a share of the surface recombination (with a corresponding recombination time $\tau_S$) as well as a function of a share of a recombination in the volume of the wafer (with recombination time $\tau_{bulk}$), can be determined by means of measurement techniques. The following applies for the effective lifetime $\tau_{eff}$:

$$\frac{1}{\tau_{eff}} = \frac{1}{\tau_S} + \frac{1}{\tau_{bulk}}$$

For the quality determination of a wafer per lifetime measurements, surface effects must thus be reduced and eliminated as far as possible, respectively. In addition to the wafer thickness W, the surface recombination speed S plays a role for the surface recombination time $\tau_S$. In particular, the estimation applies (if S<D/4W):

$$\frac{1}{\tau_S} = \frac{2S}{W}$$

A possibility for reducing surface effects (that is, the surface recombination speed S) lies in providing the wafer surface with a passivation in the form of a dielectric coating (e.g. consisting of oxide, nitride or a polymer). The number of the surface conditions is thus reduced and/or a band deflection is induced at the surface, which reduces the speed of the recombination via surface conditions.

The problem, which is to be solved by the instant invention, is to enable a determination of the wafer quality during the solar cell production by means of lifetime measurement, which is more accurate than was the case previously.

SUMMARY OF THE INVENTION

This problem is solved by means of the method comprising the features according to the claims.

According thereto, a method for characterizing wafers during the production of solar cells is given, which encompasses the steps:
a) providing a wafer and carrying out a production process with the wafer for producing one or a plurality of solar cells;
b) carrying out a wet chemical step with the wafer during the production process, wherein the wet chemical step reduces an influence of the wafer surface on the lifetime of charge carriers in the wafer;
c) irradiating the wafer with light during the wet chemical step or after the wet chemical step for creating charge carriers in the wafer;
d) determining the lifetime of the charge carriers created in step c); and
e) characterizing the wafer by means of the lifetime determined in step d).

This method prevents an extensive passivation, such as the creation of an oxide layer on the wafer surface by means of thermal oxidation or application of a silicon nitride coating on the surface prior to the lifetime measurement. The passivation (that is, the reduction of the surface conditions and generally the reduction of the surface influence, respectively) of the wafer is performed exclusively via the wet chemical step.

The possibility of creating a sufficient surface passivation by means of a wet chemical step is used by the instant invention for performing a passivation of the wafer prior to the lifetime determination in the production process, which enables an assessment of the wafer quality by means of the lifetime measurement, which is more accurate than was the case previously. With the invention, the passivation (by means of the wet chemical step) as well as the determination of the lifetime is performed in the production process, that is, "in-line".

The wet chemical step can thereby comprise an etching step as well as a cleaning step. In an example, the wet chemical step is performed as an etching by using an acidic etching solution. In particular hydrofluoric acid can thereby be used as etching solution, preferably in weaker concentrations (e.g., concentrations of below five percent by volume, which makes the exposure to the hydrofluoric acid safer and thus simplifies the handling of the acid). However, other solutions, e.g., an iodine-ethanol solution, can also be used for the wet chemical step.

The wet chemical step can be provided as an additional etching step, but preferably it is a wet chemical step, which is already present in the production process. For example, this could be saw damage etching, which is to be carried out at the onset of a common solar cell production process. The determination of the lifetime can thereby be carried out during the etching (for example while the wafer is still in the basin) or following the etching. A lifetime determination directly during or immediately after the saw damage etching has the advantage that material of low lifetime (that is, being of poor quality) can already be separated out at the onset of the production process.

Another possibility for using an etching step for the surface passivation, which is typically already present in the production process for solar cells, is to carry out the lifetime measurement during or following the cleaning etching after a POCl diffusion (diffusion with $POCl_3$). If the lifetime measurement occurs additionally after this step (e.g., in addition to a measurement, which was already performed in response to a saw damage etching), the quality change of the wafer material could be controlled by means of the POCl process step.

In principle, the determination of the lifetime can be performed as mentioned, while the wafer is still in the passivation etching solution. For measuring the lifetime, however, the wafer can also be removed from the etching solution. However, it is not absolutely necessary to perform the lifetime measurement immediately after removing the wafer from the passivation etching solution. Rinsing or cleaning steps, for example, may occur between the removal from the etching solution and the lifetime measurement.

For the lifetime determination, a certain time interval, in which the passivation effect of the etching solution stops after removing the wafer from the etching solution, is available here.

In an embodiment of the invention, the wafer is irradiated using a light pulse, which can be created by a flash lamp, an LED device or a laser, for example. In the wafer, the light pulse creates charge carriers and a charge carrier density, respectively, the decay of which is measured so as to determine the lifetime of the created charge carriers.

In principle, different methods are known for measuring the lifetimes of charge carriers, which are created in solar wafers. Preferably, the inherently known QSSPC method (quasi steady state photo conductance) is used in the instant invention, see R. A. Sinton, A. Cuevas, "Contactless determination of current-voltage characteristics and minority-carrier lifetimes in semiconductors from quasi-steady-state photoconductance data", Appl. Phys. Lett. 69(17), p. 2510, 1996. In this method, the wafer, which is to be characterized, is inductively coupled to an oscillating circuit via a coil and is excited by means of a light pulse. During the light pulse, the voltage in the oscillating circuit is determined, whereby the voltage in the oscillating circuit is a function of the conductivity of the wafer. In turn, the lifetime of the charge carriers, which are created in the wafer by means of the light pulse, can be determined via the conductivity of the wafer.

The advantage of the QSSPC method is that the measurement can be performed with the use of a very high speed so that the clock cycle (and thus the throughput) of the solar cell production must not be reduced in the production process. As mentioned, additional methods for the lifetime determination exist, which, in principle, can also be used within the scope of the invention. In particular, this also includes methods, which permit a spatially resolved measurement of the lifetime beyond the wafer, for example by means of MW-PCD (microwave-detected photoconductance decay), PL (photoluminescence) or CDI-ILM (carrier density imaging-infrared camera lifetime mapping).

With a spatially resolved measurement, the lifetime determination is performed at various locations of the wafer. Several selected points of the wafer surface can be measured here, for example. However, a denser network of points of the wafer surface can also be scanned, depending on the spatial resolution of the used measuring method.

In a second aspect of the invention, provision is made for a device for characterizing wafers during the production of solar cells, which encompasses a container for accommodating wet chemistry (e.g. an etching or rinsing agent), into which a wafer for carrying out a wet chemical or cleaning step can be introduced.

Furthermore, the device encompasses a light source, which is disposed in relation to the container in such a manner that, by using the light of the light source, charge carriers can be created in a wafer, which is located in the container during a wet etching or cleaning step. Additionally, measuring means for determining the lifetime of charge carriers, which are created in a wafer by means of the light source, are disposed.

The device as claimed in the invention is embodied in such a manner that it can be used in a production line for producing solar cells and thus enables the integration of a meaningful quality control per lifetime measurement in an automated production process for solar cells.

In particular, the light source can create light pulses and can be, for example, a flash lamp, an LED configuration or a pulsed laser. The light source is disposed relative to the basin in such a manner that it can illuminate a wafer, which is located in the basin. An etching step or a cleaning step can thereby be carried out in the basin.

As already described above with reference to the method as claimed in the invention, the etching step can be an additional passivation step or an etching step, which is already present in the normal production process for solar cells. Accordingly, a cleaning step, which is to be carried out by means of the basin, can also be an additional cleaning step (e.g. by means of using water and DI-water, respectively), which is introduced in view of the lifetime measurement; or it is a cleaning step, which is already present in the normal production process.

In particular, the measuring means for carrying out an inherently known measuring method are embodied for the lifetime determination. As already mentioned above, the lifetime measurement is preferably preformed with the use of the QSSPC method. For this purpose, the measuring means can comprise an electromagnetic oscillating circuit with an inductivity, via which a wafer, which is located in the container during a wet-etching or cleaning step, can be coupled to the electromagnetic oscillating circuit. The conductivity of the wafer and thus the lifetime of charge carriers in the wafer can thereby be determined via the voltage in the oscillating circuit. In particular a coil, which is disposed on the container and which preferably encompasses an inner diameter of approximately 8 cm, is used as inductivity.

Provision is made for a control unit for controlling the measurement and the light source for the purpose of creating charge carriers in the wafer, which is to be characterized. This can be a computer, for example, which controls the light source and simultaneously captures the voltage in the oscillating circuit during the light pulse (when using the QSSPC method).

A further embodiment of the device additionally provides transport means (for example a conveyor), with which a wafer can (automatically) be moved to the container for accommodating a wet etching or a rinsing agent.

BRIEF DESCRIPTION OF THE DRAWINGS

The instant invention will be explained below in more detail by means of exemplary embodiments, with reference to the figures.

DETAILED DESCRIPTION OF THE DRAWINGS

Figure 1:
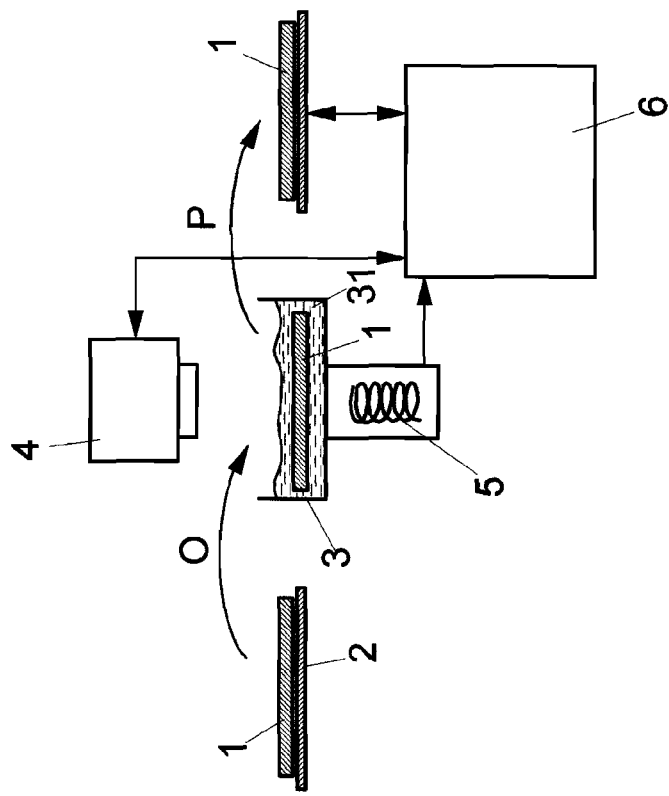
FIG. 1 shows, schematically, a device for determining the lifetime in a wafer during a solar cell production process.

FIG. 1 shows, schematically, a device for measuring the lifetime during the production of solar cells as well as the course of the lifetime measurement. The device comprises a basin 3, which is filled with an etching or cleaning solution 31 for carrying out an etching or cleaning step. A wafer 1 present in the production process is supplied to the basin 3 by means of a transport system 2 (arrow O) and is transported away from the basin 3 (arrow P), respectively. In addition to the automated transporting of the wafer 1, provision can also be made for a device (not illustrated), with which the wafer can be automatically introduced into the etching or cleaning solution.

A flash lamp 4 is disposed above the basin 3. With the flash lamp 4, it is possible to create a light pulse, which generates charge carriers in a wafer 1, which is located in the basin 3. The lifetime of said charge carriers is to be measured for determining the wafer quality. For the lifetime measurement (according to the QSSPC method), an inductivity in the form of a coil 5 is disposed below the basin 3.

Via the coil 5, the wafer 1 located in the basin 3 can be coupled to an oscillating circuit (not illustrated). The voltage in the oscillating circuit is measured by means of a control and evaluation unit 6, which is connected with the coil 5 and the oscillating circuit, via which the conductivity (and thus the lifetime of the charge carriers available in the wafer) of the wafer, which is still located in the basin 3, can be determined.

At the same time, the unit 6 also controls the flash lamp 4 so that the excitation of charge carriers in the wafer (via the light pulse) and the subsequent determination of the lifetime of the created charge carriers proceed in a synchronized manner.

In addition, the unit 6 can also take over and support, respectively, the control of the transport system 2 so that a movement of the wafers present in the production process to the basin 3 can be performed in cycle with the lifetime measurement.

Figure 2:
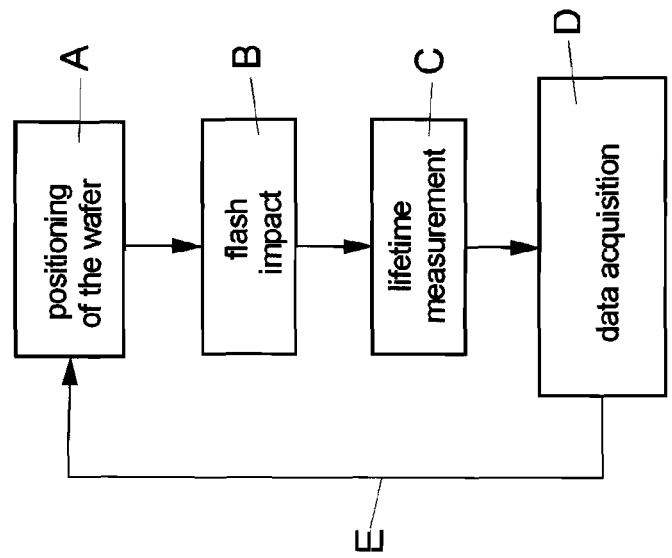
FIG. 2 shows a flowchart, which illustrates the course of a lifetime measurement.

FIG. 2 shows the course of a lifetime measurement during a solar cell production process (in-line measurement). Initially, the wafer is placed in relation to a light source (step A). After the correct placement of the wafer (preferably as shown in FIG. 1 in an etching and rinsing basin, respectively), the wafer is irradiated with a flash, whereby charge carriers are created in the wafer (step B).

Subsequently, the measurement of the lifetime of the created charge carriers is performed according to step C. Subsequently, the measured data (that is, the lifetime) is captured according to step D. Additionally, a comparison of the lifetime data with comparative data can be performed in addition to the capturing so that an immediate quality assessment of the wafer is possible.

Through this, wafers with qualities, which are too poor, can be directly removed from the production process, which contributes to the saving of costs, because a complete processing of wafers of poor quality is avoided. After the capturing of the data, the next wafer is supplied to the measuring device according to arrow E.

In an alternative embodiment, the lifetime measurement is performed in a spatially resolved manner, that is, at different locations of the wafer. Here, a selective separation of individual components (solar cells), which were formed in wafer regions having lifetimes, which are too short, can be performed after the end of the process. It goes without saying that a complete wafer can already be removed from the process prior to the end of the process, if it encompasses too many regions with a short lifetime.

The invention claimed is:

1. A method for characterizing wafers during the production of solar cells, comprising the steps:
   a) providing a wafer and carrying out a production process with the wafer for producing a solar cell or a plurality of solar cells;
   b) carrying out a wet chemical step with the wafer during the production process, wherein the wet chemical step decreases an influence of a wafer surface on a lifetime of charge carriers in the wafer;
   c) irradiating the wafer with light for creating the charge carriers in the wafer during the wet chemical step;
   d) determining the lifetime of the charge carriers created in step c); and
   e) characterizing the wafer by means of the lifetime determined in step d).

2. The method according to claim 1, wherein the wet chemical step comprises an etching or a cleaning step.

3. The method according to claim 1, wherein the wet chemical step is performed by using an acidic etching solution.

4. The method according to claim 3, wherein the wet chemical step is performed by using hydrofluoric acid.

5. The method according to claim 1, wherein the wet chemical step according to step b) is, at the same time, an etching or a cleaning step of the production process.

6. The method according to claim 1 wherein, at the onset, the production process encompasses a saw damage etching step, which is, at the same time, the wet chemical step according to step b).

7. The method according to claim 1, wherein the production process comprises a diffusion step for doping the wafer and wherein a cleaning step, which is performed after the diffusion step, is, at the same time, the wet chemical step according to step b).

8. The method according to claim 1, wherein the wet chemical step is performed by means of introducing the wafer into an etching or rinsing solution.

9. The method according to claim 8, wherein the wafer is removed from the etching and rinsing solution, respectively, for determining the lifetime.

10. The method according to claim 9, wherein the wafer is introduced into an etching solution and in that the determination of the lifetime is performed without carrying out a rinsing or cleaning step after removing the wafer from the etching solution.

11. The method according to claim 8, wherein the wafer remains in the etching or rinsing solution during the determination of the lifetime.

12. The method according to claim 9, wherein at least one rinsing and/or cleaning step is performed prior to the determination of the lifetime.

13. The method according to claim 1, wherein the irradiation of the wafer Is performed by means of a light pulse, in particular by means of a flash lamp, an LED device or a laser.

14. The method according to claim 13, wherein, for determining the lifetime:
   the wafer is inductively coupled to an oscillating circuit via a coil, and
   the voltage in the oscillating circuit, which is a function of the conductivity of the wafer, is determined during the light pulse, wherein the lifetime of the charge carriers, which are created in the wafer by means of the light pulse, can be determined via the conductivity.

15. The method according to claim 14, wherein, in addition to the wafer, a reference sample, for which the lifetime of charge carriers, which can be created therein under the influence of light is known, is, at the same time, irradiated with the light pulse.

16. The method according to claim 1, wherein the determination of the lifetime is carried out at different locations of the wafer.

17. A method for characterizing wafers during the production of solar cells, comprising the steps:
  a) providing a wafer and carrying out a production process with the wafer for producing a solar cell or a plurality of solar cells;
  b) carrying out a wet chemical step with the wafer during the production process, wherein the wet chemical step decreases an influence of a wafer surface on a lifetime of charge carriers in the wafer; wherein the wet chemical step is a saw damage etching step that has a passivation effect on the wafer;
  c) irradiating the wafer with light for creating the charge carriers immediately after the saw damage etching step;
  d) determining the lifetime of the charge carriers created in step c), wherein an oxide passivation of the wafer is prevented prior to determining the lifetime of the charge carriers; and
  e) characterizing the wafer by means of the lifetime determined in step d), wherein at least steps c) and d) are performed in-line during the production process before the passivation effect of the saw damage etching step stops.

18. A method for characterizing wafers during the production of solar cells, comprising the steps:
  a) providing a wafer and carrying out a production process with the wafer for producing a solar cell or a plurality of solar cells;
  b) carrying out a wet chemical step with the wafer during the production process, wherein the wet chemical step decreases an influence of a wafer surface on a lifetime of charge carriers in the wafer; wherein the wet chemical step is a cleaning step which is performed after a diffusion step for doping the wafer
  c) irradiating the wafer with light for the creating charge carriers in the wafer during the wet chemical step or immediately after the wet chemical step;
  d) determining the lifetime of the charge carriers created in step c) during a certain period of time in which a passivation effect of the wet chemical etching step is present; and
  e) characterizing the wafer by means of the lifetime determined in step d), wherein steps c) and d) occur in-line during the production process.

* * * * *